US008032342B2

(12) United States Patent
Levy

(10) Patent No.: US 8,032,342 B2
(45) Date of Patent: *Oct. 4, 2011

(54) SEGMENTATION AND INTERPOLATION OF CURRENT WAVEFORMS

(75) Inventor: Harold J. Levy, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 210 days.

This patent is subject to a terminal disclaimer.

(21) Appl. No.: 12/432,717

(22) Filed: Apr. 29, 2009

(65) Prior Publication Data

US 2009/0210204 A1    Aug. 20, 2009

Related U.S. Application Data

(63) Continuation of application No. 10/976,468, filed on Oct. 29, 2004, now Pat. No. 7,421,379.

(51) Int. Cl.
*G06F 17/10* (2006.01)
(52) U.S. Cl. .............................................. 703/2; 703/14
(58) Field of Classification Search ................ 703/2, 13, 703/14; 716/1, 4
See application file for complete search history.

(56) References Cited

U.S. PATENT DOCUMENTS

| | | | |
|---|---|---|---|
| 7,013,440 B2 | 3/2006 | Croix | |
| 7,065,720 B2 | 6/2006 | Croix | |
| 7,191,414 B1 | 3/2007 | Croix | |
| 7,546,227 B2 * | 6/2009 | Levy | ................... 703/2 |

OTHER PUBLICATIONS

Agarwal et al., "A Library Compatible Driving Point Model for On-Chip RLC Interconnects", Proceedings of the $8^{th}$ ACM/IEEE International Workshop on Timing Issues in the Specification and Synthesis of Digital Systems, Dec. 2002, pp. 65-71.
Agarwal et al., "An Effective Capacitance Based Driver Output Model for On-Chip RLC Interconnects", Proceedings of the $40^{th}$ Conference on Design Automation, Jun. 2003, pp. 376-381.
Arunachalam et al., "CMOS Gate Delay Models for General RLC Loading", Proceedings of the 1997 Int'l Conference on Computer Design (ICCD '97), IEEE 1997, 6 pgs.
Dartu et al., "Performance Computation for Precharacterized CMOS Gates With RC Loads", IEEE Transactions on Computer-Aided Design of Integrated Circuits and Systems, vol. 15, No. 5, May 1996, pp. 544-553.
Deokar, Rahul, Website article: "EEdesign—A New Approach to Nanometer Delay Modeling", Mar. 4, 2004, 8 pgs.

(Continued)

*Primary Examiner* — Russell W Frejd
(74) *Attorney, Agent, or Firm* — Bever, Hoffman & Harms, LLP; Jeanette S. Harms

(57) ABSTRACT

A method for generating a linear piecewise representation of a driver output current signal includes segmenting the driver output current signal such that an integral of each segment matches an actual voltage change in corresponding portion of an associated output voltage signal (within a desired tolerance). The beginning and ending current/time values for each segment can then be compiled into the piecewise linear representation of the driver output current signal. A method for generating a model driver output current signal includes conformally mapping first and second sets of precharacterization output current data based on a weighted average of the indexing parameter (e.g., input slew or output capacitance) values for the model driver output signal and the first and second sets of precharacterization data.

23 Claims, 10 Drawing Sheets

OTHER PUBLICATIONS

Gordon et al., "Time-Domain Simulation of Multiconductor Transmission Lines with Frequency-Dependent Losses", IEEE Transactions on Computer-Aided Design, vol. 11, No. 11, Nov. 1992, pp. 1372-1387.

Uchino et al., "An Interconnect Energy Model Considering Coupling Effects", IEEE Transactions on Computer-Aided Design of Integrated Circuits and Systems, vol. 21, No. 7, Jul. 2002, pp. 763-776.

* cited by examiner

SEGMENTATION AND INTERPOLATION OF CURRENT WAVEFORMS

RELATED APPLICATIONS

This application is a continuation of U.S. patent application Ser. No. 10/976,468, entitled "SEGMENTATION AND INTERPOLATION OF CURRENT WAVEFORMS" filed Oct. 29, 2004 which issued as U.S. Pat. No. 7,421,379 on Sep. 2, 2008.

BACKGROUND OF THE INVENTION

1. Field of the Invention

The invention relates to the field of EDA design, and more particularly to a system and method for efficiently storing precharacterization data and accurately generating model output data from that precharacterization data.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer). The models define performance parameters for the cells; e.g., parameters related to the operational behavior of the cells, such as power consumption, output slew, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the component steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS® family of products.

As indicated in FIG. 1, timing analyses can be performed at various points along the EDA process, such as during synthesis, design planning, netlist verification, and analysis (as indicated by the bolded chevrons). Timing analyses typically involve the modeling of delays as a signal propagates through a network of cells. The accuracy of the delay calculations controls the quality of the final IC produced using EDA systems.

To perform a timing analysis, the IC design (or a portion of the IC) is defined as a network of drivers and receivers. Cells designated as drivers provide stimuli to the network, and the resulting waveforms are received by the cells designated as receivers. For example, FIG. 2 shows a schematic diagram of a sample driver-receiver network 200 that includes a driver (cell) 210 and a receiver (cell) 230. An input pin 211 of driver 210 receives a driver input signal S_IND and generates a driver output signal S_OUTD at a driver output pin 212. This signal is transmitted across an interconnect element 220 and is received as a receiver input signal S_INR at a receiver input pin 231 of receiver 230 (depicted as an inverter for exemplary purposes). Receiver 230 processes receiver input signal S_INR and generates a receiver output signal S_OUTR at a receiver output pin 232. Note that receiver 230 can also function as a driver for downstream cells, as indicated by load 240 connected to receiver output pin 232.

Conventional driver models represent transistor behavior by indexing the output voltage behavior of the driver by input slew and output capacitance. For example, FIG. 3 shows a conventional driver model 210A for modeling driver cell 210 shown in FIG. 2. Driver model 210A includes a time-dependent voltage source V210A in series with a drive resistor R210A and driver output pin 212A, and an output capacitor C210A coupled between pin 212A and ground. Driver model 210A is sometimes referred to as a "Thevenin model". Driver model 210A is precharacterized (via SPICE simulations or actual device measurements) by applying a range of driver input signals S_INA (e.g., precharacterization input signals S_INA1 through S_INAP) to input pin 211A across a range of capacitance values for output capacitor C210A (e.g., precharacterization capacitance values C1 through CN). Each input signal S_INA exhibits a particular input slew SI (i.e., the time required for the signal to go from one logic state to the opposite logic state) and a particular input delay time TDI (i.e., the time at which input signal S_INA reaches a threshold level). The resulting driver model output signals S_OUTA (e.g., output signals S_OUTA1 through S_OUTAQ) each exhibit a particular output slew SO and an output delay time TDO. By subtracting the input delay time TDI of an input signal S_INA from the output delay time TDO of the associated output signal S_OUTA, an output delay value DOUT can be determined. The output slew SO and the output delay value DOUT for each of output signals S_OUTA can then be indexed by input slew SI and output capacitances C1 through CN in a precharacterized library cell entry for driver cell 210.

Thus, conventional driver models are generally extracted from libraries of output slew and output delay values. However, as the devices used to instantiate the driver cells in a system continue to shrink, the driver cells formed from those devices begin to exhibit increasingly non-linear responses that complex output current responses that are not adequately described by output slew and delay. For example, reduced device dimensions generally result in faster circuits, which in turn requires greater modeling accuracy. To provide this enhanced modeling accuracy, the nuances of device behavior (in particular output current behavior) must be properly captured.

Therefore, advanced EDA tools have begun to incorporate output current-based schema (rather than output voltage-based schema) for cell modeling. In particular, modern driver models for gate-level delay calculations with parasitics make use of current-versus-time (I(t)) and current-versus-voltage (I(V)) characteristics obtained from current and voltage waveforms in time, Iout(t) and Vout(t) respectively. This data is measured over sets of varying input slew and output capacitance values. By interpolating the output current data along these sets of precharacterization input slew and output capacitance values, model output signals can be derived for given sets of actual input slew and output capacitance values.

A major issue in the customer adoption of current-based driver models is the amount of data-storage required. Precharacterization output current signals (generated either via actual device measurements or via mathematical (e.g., HSPICE) simulations) are converted into piecewise linear representations consisting of sets of current values indexed by sets of corresponding time values. Each pair of current and time values represents a point on a precharacterization output current curve. For example, Table 1 depicts an exemplary cell library entry for driver model 210A (described with respect to FIG. 3).

TABLE 1

|  | Time | SET1 (SinpA, CoutA) | SET2 (SinpB, CoutA) |
| --- | --- | --- | --- |
| Driver Model 210A | t1 | IoutA1 | IoutB1 |
|  | t2 | IoutA2 | IoutB2 |
|  | t3 | IoutA3 | IoutB3 |
|  | t4 | IoutA4 | IoutB4 |
|  | t5 | IoutA5 | IoutB5 |
|  | t6 | IoutA6 | IoutB6 |
|  | t7 | IoutA7 | IoutB7 |
|  | t8 | IoutA8 | IoutB8 |
|  | t9 | IoutA9 | IoutB9 |
|  | t10 | IoutA10 | IoutB10 |

Table 1 includes sets of output current data for two output current signals S_OUTA and S_OUTB. Output current signals S_OUTA and S_OUTB are associated with different input slews SinpA and SinpB, respectively, but are associated with the same output capacitance CoutA. The signal data for output current signal S_OUTA includes output current values IoutA1 through IoutA10, which are indexed by time values t1 through t10, respectively. Similarly, the signal data for output current signal S_OUTB includes output current values IoutB1 through IoutB10, which are indexed by time values t1 through t10, respectively. Note that some conventional driver models store output voltage over time, from which output current values can be calculated using the equation Iout=Cout*dVout/dt.

As evident from Table 1, the larger the number of time values (and corresponding output current values) used to generate the data for an output signal, the more accurate the piecewise linear representation of the actual output signal becomes. At the same time, increasing the number of data points also increases the data storage and computational requirements associated with the driver model. Therefore, generation of a piecewise linear representation of an output current signal involves balancing model accuracy with model size.

Furthermore, due to the nature of output current response curves indexed by input slew and output capacitance, standard interpolation along either input slew or output capacitance can sometimes provide inaccurate results. For example, FIG. 4 shows a graph of sample precharacterization output current signals S_OUT1 and S_OUT2, which are associated with the same output capacitance value (5 fF) but different input slew values (100 ps and 200 ps, respectively).

Also depicted in FIG. 4 is a graph of an interpolated output current signal S_OUT-STD (represented by the dashed line) associated with the same output capacitance value (5 fF) as signals S_OUTA1 and S_OUTA2 but a different input slew value (150 ps). Interpolated output current signal S_OUT-STD is generated by directly interpolating between signals S_OUT1 and S_OUT2 according to input slew (i.e., because the input slew associated with interpolated signal S_OUT-STD is halfway between the input slews associated with precharacterization signals S_OUTA1 and S_OUTA2, the value of interpolated signal S_OUT-STD at any given time is halfway between the values of precharacterization signals S_OUTA1 and S_OUTA2.

Unfortunately, interpolated signal S_OUT-STD is not an accurate representation of the actual output signal associated with an input slew of 150 ps. As indicated by the profiles of precharacterization signals S_OUTA1 and S_OUTA2, the profile of a signal associated with an input slew of 150 ps should exhibit a single peak located between the peaks of signals S_OUTA1 and S_OUTA2 (such as described below with respect to FIG. 6A). However, due to the nature of direct interpolation, interpolated signal S_OUT-STD only exhibits peaks that are aligned with the peaks of signals S_OUTA1 and S_OUTA2, rather than a peak between those of signals S_OUTA1 and S_OUTA2.

Accordingly, it is desirable to provide a system and method for generating an output current-based driver model that minimizes storage requirements while maintaining model accuracy.

SUMMARY OF THE INVENTION

Conventional output current-based driver models store sets of output current data indexed by output capacitance and input slew (or store output voltage over time, from which output current can be calculated). The need to maintain adequate signal fidelity can lead to excessively large sets of output current data, and conventional direct interpolation between such data sets can result in model output inaccuracy. By segmenting the output current signal via integral matching to the output voltage signal, data storage requirements can be minimized. Furthermore, through the application of conformal mapping rather than direct interpolation, accurate modeling results can be achieved.

In one embodiment, a method for modeling a driver cell comprises segmenting an output current signal of the driver cell such that an integral of each segment generates a voltage change that matches (within a desired tolerance) an actual voltage change of an output voltage signal of the driver cell over the same time period. The output current/time values at the beginning and end of each segment can then be compiled into a piecewise linear representation of the output current signal. In one embodiment, linear interpolation can be applied between the initial and final output current values of each segment to simplify calculations.

When performing a segmenting operation, each segment can be generated by selecting a start time for the segment, and then increasing the end time of the segment until the integral of the current across the segment (i.e., the expected voltage change) differs from the actual voltage change (from the output voltage signal) by more than a predefined tolerance (which can either be a constant tolerance across the waveform or can vary across the waveform (e.g., tighter tolerances at a signal peak)). In one embodiment, once this tolerance violation is detected, the end time of the segment is set at the last time value that allowed the expected voltage change to match the actual voltage change. For example, if the end time is increased by a constant time increment with each pass, the final end time of the segment can be generated by subtracting the time increment from the end time value that first causes a tolerance violation.

In another embodiment, a modeling system can include logic for segmenting an output current signal such that and expected voltage change associated with each segment matches an actual voltage change in a corresponding portion of an associated output voltage signal. In one embodiment, the segmenting logic can include interval selection logic for defining an initial segment time and an ending segment time, integration logic for integrating the output current between the initial segment time and the ending segment time to generate an expected voltage change, and finalization logic for comparing the expected voltage change with an actual voltage change between the initial segment time and the ending segment time exhibited by an associated output voltage signal, the finalization logic also instructing the interval selection logic to increase the ending segment time until the expected voltage change differs from the actual voltage change by more than a specified tolerance. In one embodiment, the integration logic can generate the expected voltage change via linear integration to simplify computational complexity.

In another embodiment, a method for generating a model output current signal includes conformally mapping a first and second set of output current precharacterization data according to the value of an indexing parameter (e.g., input slew or output capacitance) for the model output current signal compared to the values of the indexing parameter for the first and second sets of precharacterization data. In one embodiment, the conformal mapping can be accomplished by defining time and current weighting factors for the first and second output capacitance values, with the time and current weighting factors being based on peak values from the first and second sets of precharacterization data. The incorporation of peak value information permits the conformal mapping methodology to more accurately generate model output data (compared to direct interpolation methodologies). Separate lower and upper time/current weighting factors are used to transform the first and second sets of precharacterization data, respectively, into adjusted lower and upper data sets, respectively. The adjusted upper and lower data sets are then merged using weighted differential compensation to create the final model output data set.

In another embodiment, a modeling system can include conformal mapping logic for generating a model output data set from first and second precharacterization data sets, based on the relative values of an indexing parameter for the model output data set and the first and second precharacterization data sets. In one embodiment, the conformal mapping logic can include scale factor generation logic for generating time and current weighting factors based on indexing parameter relative values and peak output current values from the first and second precharacterization data sets, scaling logic for applying the time and current weighting factors to the first and second precharacterization data sets to generate first and second intermediate data sets, and merging logic for merging the first and second intermediate data sets using weighted differential compensation to generate the model output data set.

The invention will be more fully understood in view of the following description and drawings.

DETAILED DESCRIPTION

Conventional output current-based driver models store sets of output current data indexed by output capacitance and input slew. The need to maintain adequate signal fidelity can lead to excessively large sets of output current data, and conventional direct interpolation between such data sets can result in model output inaccuracy. By segmenting the output current signal via integral matching to the output voltage signal, data storage requirements can be minimized. Furthermore, through the application of conformal mapping rather than direct interpolation, accurate modeling results can be achieved.

Figure 1:
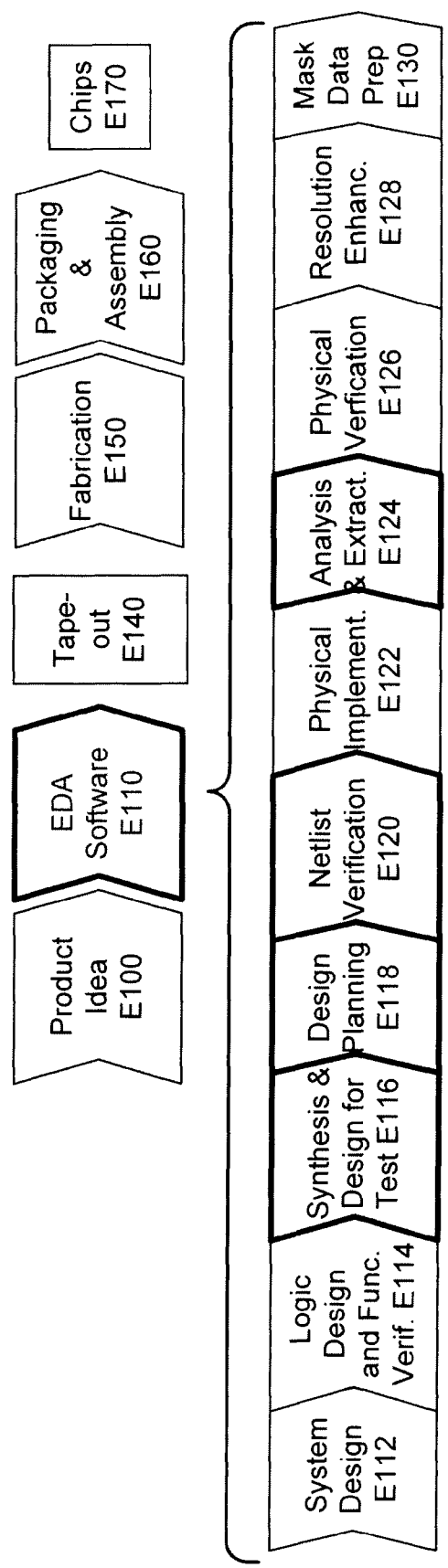
FIG. 1 shows a standard EDA process flow.
Figure 2:
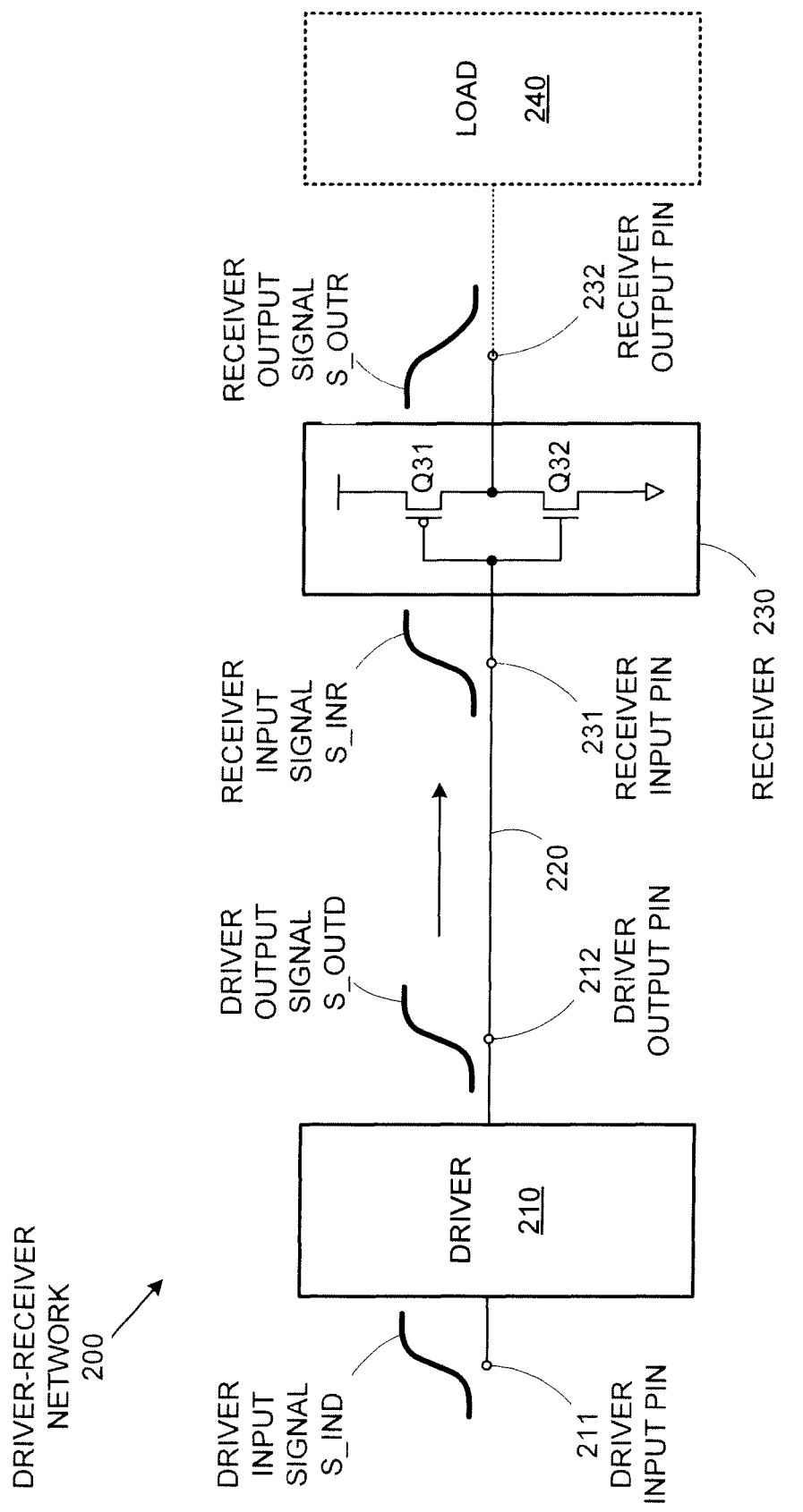
FIG. 2 is a schematic diagram of a sample driver-receiver network.
Figure 3:
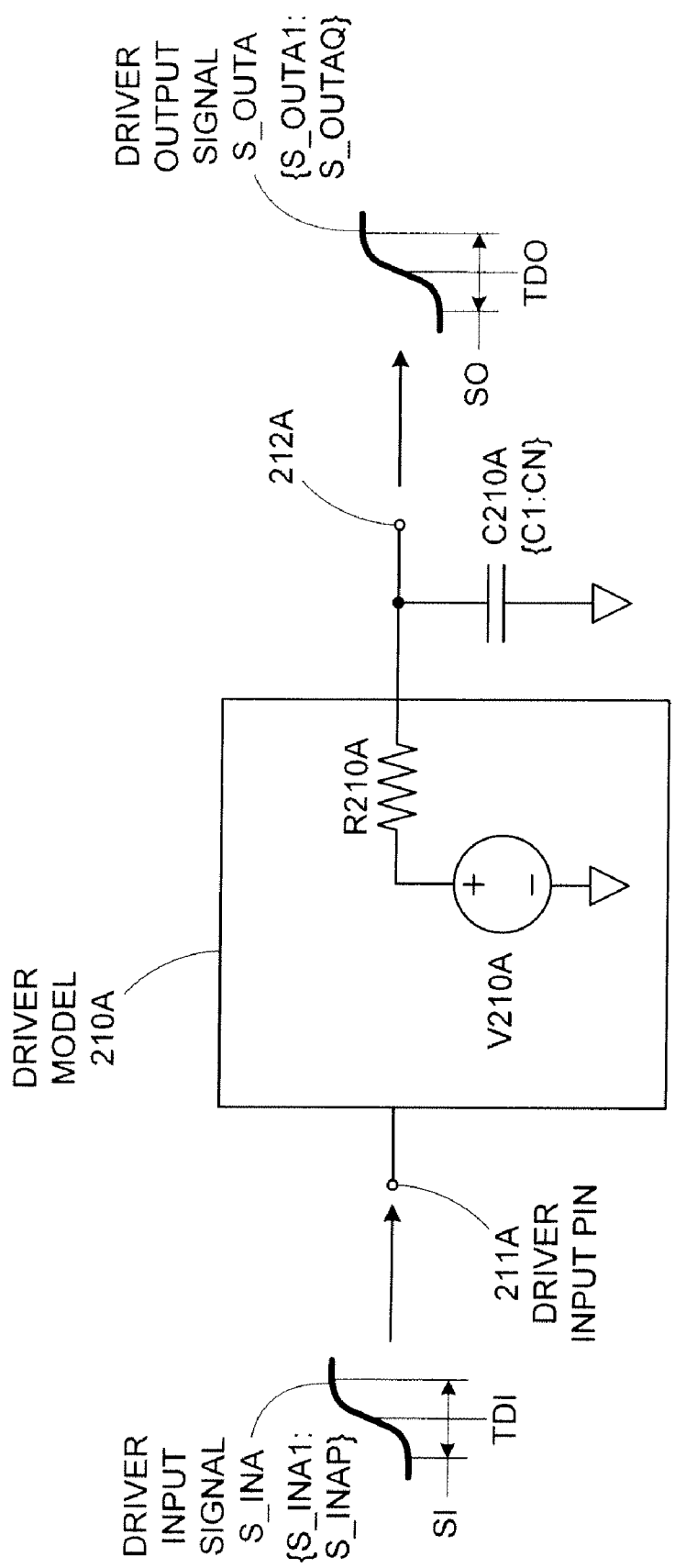
FIG. 3 is a schematic diagram of a standard driver model.

In one embodiment, output voltage-based segmenting can be performed for each pair of precharacterization output capacitance and input slew values. For example, as described above with respect to FIG. 3, driver model 210A is precharacterized by applying specific precharacterization input signals (S_INA1 through S_INAP) to driver input pin 211A over a specific set of precharacterization output capacitance values (C1 through CN). For each pair of precharacterization input signal and precharacterization output capacitance values, the output current signal and the output voltage signal can be recorded.

Figure 5A:
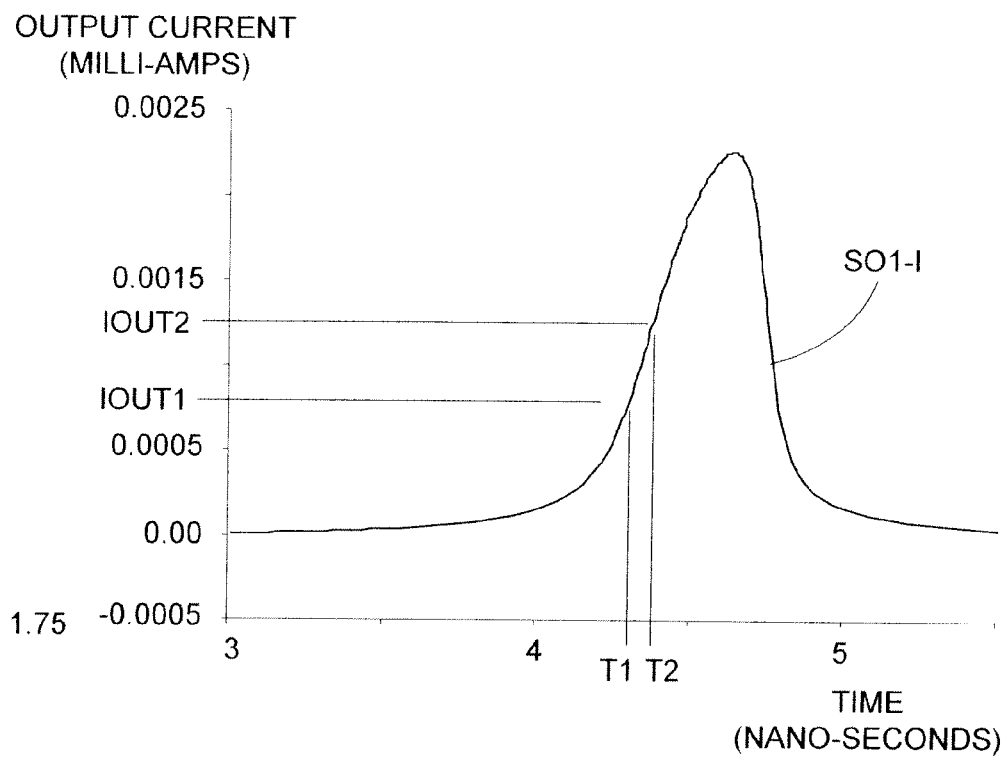
FIGS. 5A and 5B are graphs of exemplary output current and output voltage, respectively, for a driver cell with corresponding segments of each signal marked.
Figure 5B:
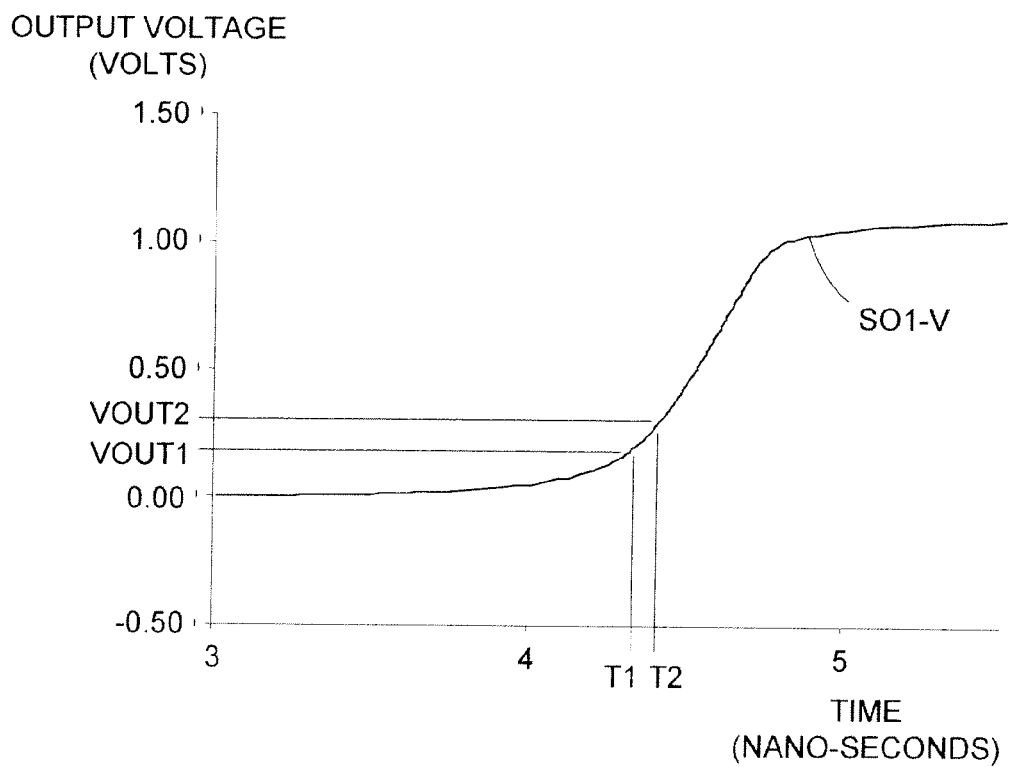

For example, FIGS. 5A and 5B show sample graphs of the precharacterization output current signal SO1-I and the precharacterization output voltage signal SO1-V, respectively, generated by a driver cell in response to a particular set of precharacterization input slew and output capacitance values. By segmenting output current signal SO1-I such that the integral of each segment matches a corresponding segment of output voltage signal SO1-V, a piecewise linear representation (i.e., a set of data point representing output current signal SO1-I) can be derived that maintains reasonable accuracy while minimizing storage requirements.

To perform the segmentation, precharacterization output current signal SO1-I is divided along a sequence of time intervals. Each time interval is selected such that the change in output voltage signal SO1-V over the time interval is within some tolerance of an expected change in output voltage, the expected change in output voltage being determined by integrating the output current signal SO1-I over the time interval. Note that while in one embodiment the actual output current signal SO1-T could be integrated over the time interval, according to another embodiment of the invention, the calculation can be simplified by performing a linear integration over the time interval.

Specifically, by assuming that the output current varies linearly over the time interval, the expected change in output voltage can be calculated by the following:

$$\Delta VEXP = IAVG * \Delta T / COUT \quad [1]$$

where $\Delta VEXP$ is the expected change in output voltage signal SO1-V over the time interval, IAVG is the average value of the output current signal SO1-I over the time interval, $\Delta T$ is the actual time interval, and COUT is the precharacterization output capacitance value associated with output voltage signal SO1-V and output current signal SO1-I.

Thus, for example, the time interval may begin at a time T1 and end at a time T2, as shown in FIGS. 5A and 5B. Time T1 corresponds to an output current value IOUT1 as shown in FIG. 5A (i.e., IOUT1=SO1-I(T1)), and an output voltage value VOUT1 as shown in FIG. 5B (i.e., VOUT1=SO1-V (T1)). Time T2 corresponds to an output current value IOUT2 (=SO1-I(T2)) and an output voltage value VOUT2 (=SO1-V(T2)). Equation 1 can therefore be expressed as:

$$\Delta VEXP = \frac{1}{2}(IOUT2 + IOUT1) * (T2 - T1) / COUT \quad [2]$$

Time T2 is then increased until the difference between $\Delta VEXP$ and the actual change in output voltage signal SO1-V over the time interval is greater than the predetermined tolerance, as indicated by the following:

$$DEV > TOL \quad [3]$$

where TOL is the predetermined tolerance value (e.g., 10 mV), and DEV is the deviation between the expected voltage change and the actual voltage change, as given by the following:

$$DEV = \Delta VEXP - (VOUT2 - VOUT1) \quad [4]$$

Once time T2 reaches a point at which Equation 3 is satisfied, the time interval is finalized, thereby defining a data point for the model of output current signal SO1-I. The value of time T2 is then used as the initial time (i.e., time T1) for the next time interval, and the process is repeated until the entire output current signal SO1-I is segmented. Note that tolerance value TOL may be a constant value across the entire signal or can be a variable tolerance that provides different fit requirements for different portions of the output signal. For example, in one embodiment, tolerance value TOL may be reduced at a signal peak, thereby requiring that the model more closely match the actual signal around that peak.

Note further that the finalization of the time interval can involve selecting a final value for time T2 that is not necessarily equal to the value that satisfies Equation 3. For example, time T2 can be set equal to a time value just before the value that satisfies Equation 3. In one embodiment, time T2 can be increased by predetermined increments during the segmenting process. When time T2 reaches a value that causes Equation 3 to be satisfied, time T2 can be reduced by the predetermined increment to finalize the time interval.

By selecting the final value of time T2 in this manner, the accuracy of the resulting piecewise linear model can be increased. Typically, deviation DEV increases abruptly at a segment boundary due to some salient feature in the simulation data. Therefore, by terminating the segment before tolerance TOL is exceeded, the total output voltage error provided by the resulting piecewise linear model is much less than the theoretical upper bound. In this manner, the match between the stored piecewise linear representation of precharacterization output current signal SO1-I and the signal itself can be significantly enhanced.

Figure 5C:
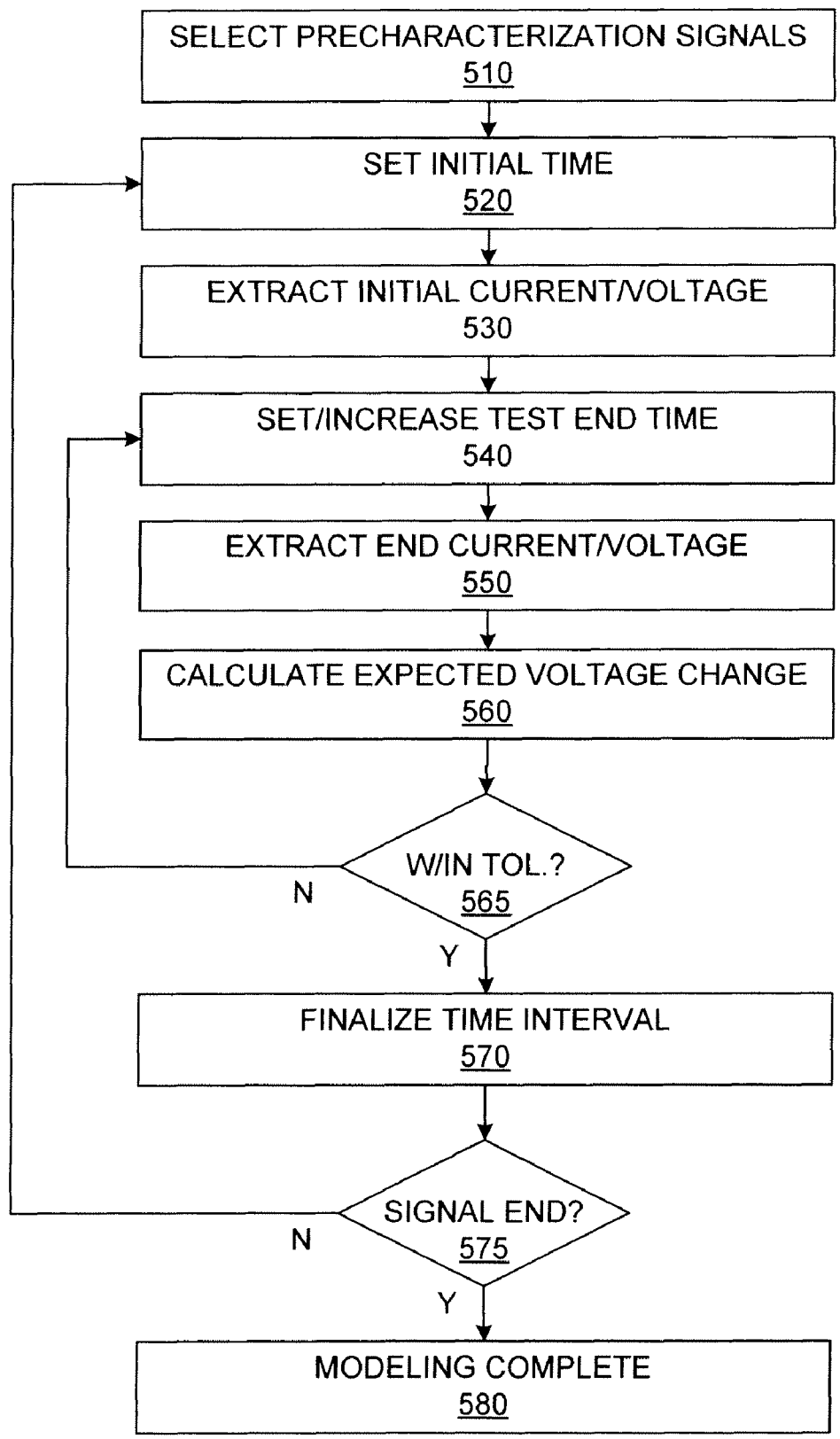
FIG. 5C is a flow diagram of an integral-matching methodology for generating a piecewise linear representation of a current output signal.

FIG. 5C shows a flow diagram of the above-described process for the generation of a piecewise linear model of an output current signal. In a "SELECT PRECHARACTERIZATION SIGNALS" step 510, the output current signal and associated output voltage signal for a particular combination of precharacterization input slew and output capacitance values are selected. Next, an initial time (e.g., time T1) for a time interval is selected in a "SET INITIAL TIME" step 520. Note that at the beginning of the segmentation process, the first initial time value can be selected to be any time before the output current signal begins changing (note that the output of a driver cell may exhibit activity due to external factors, such as capacitive coupling with other drivers).

Once the initial time is set, initial current and voltage values (e.g., IOUT1 and VOUT1) can be determined from the precharacterization output current and output voltage signals, respectively, in an "EXTRACT INITIAL CURRENT/VOLTAGE" step 530. A test end time (e.g., time T2) for the time interval is selected in a "SET/INCREASE TEST END TIME" step 540. From this test end time, end current and voltage values (e.g., IOUT2 and VOUT2) can be determined from the precharacterization output current and output voltage signals, respectively, in an "EXTRACT END CURRENT/VOLTAGE" step 550.

Next, using precharacterization output capacitance value, the initial time value, the test end time value, the initial current value, and the end current value, an expected voltage change is calculated (using Equation 2) in a "CALCULATE EXPECTED VOLTAGE CHANGE" step 560. The difference between this expected voltage change and the actual change in output voltage is compared to a predetermined voltage change tolerance value (using Equations 3 and 4) in a "WITHIN TOLERANCE?" step 565.

If the difference between the expected voltage change and the actual voltage change is less than the tolerance value, the process loops back to step 540 and the test end time is increased. In one embodiment, each time the process loops back to step 540, the test end time is increased by a predetermined time increment. If the difference between the expected voltage change and the actual voltage change is greater than the tolerance value, the time interval is finalized in a "FINALIZE TIME INTERVAL" step 570.

In step 570, a final value is selected for the end time of the time interval, and that final time value (and associated output current value) is stored as a point in the piecewise linear representation of the output current signal. As described above with respect to FIGS. 5A and 5B, the final value for the end time of the time interval can be selected to be just below the time that (first) causes the expected voltage change to exceed the actual output voltage change by the tolerance value. In one embodiment, if the test end time is increased by a predetermined time increment during step 540, the final time value can be determined by subtracting one time increment from the test end time when the voltage change tolerance value is exceeded.

The progress of the segmentation operation is then assessed in a "SIGNAL END?" step 575. If the output current signal has been fully segmented, then the process ends in a "MODELING COMPLETE" step 580. Otherwise, the process loops back to step 520, where the final time value determined in step 570 is set as the new initial time value, and the segmentation process continues. In this manner, an efficient and accurate piecewise linear representation of an output current signal can be generated.

Figure 5D:
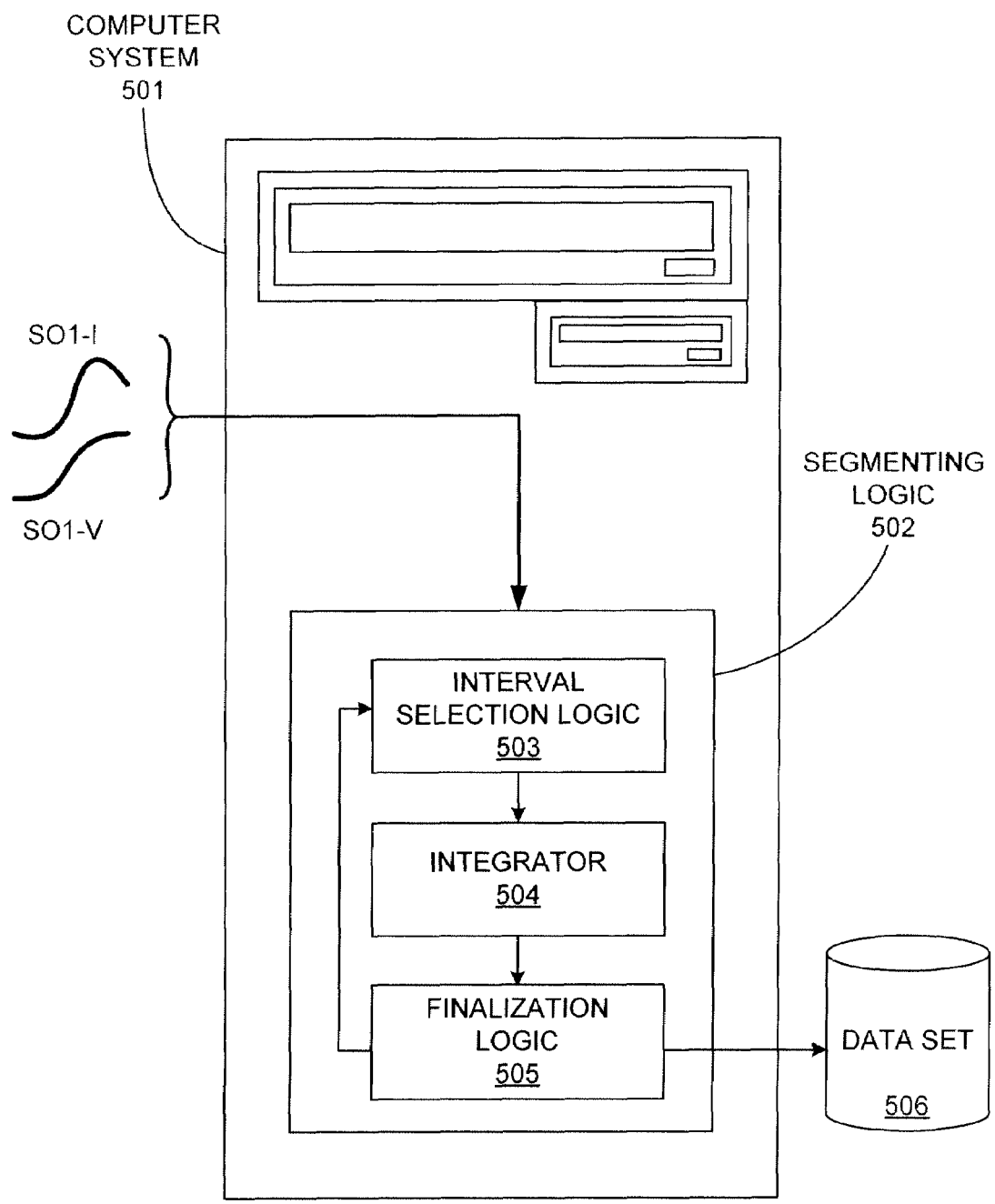
FIG. 5D is a block diagram of a system for generating a piecewise linear representation of a current output signal using an integral-matching methodology.

FIG. 5D shows a computer system 501 that includes segmenting logic 502 for transforming actual driver output current signal SO1-I into a piecewise linear representation data set 506 using actual driver output voltage signal SO1-V, according to the steps described with respect to FIG. 5C. Segmenting logic 502 includes interval selection logic 503 for setting (and adjusting) each time interval (e.g., steps 520 and 540), an integrator 504 for generating the expected voltage change over the time interval (e.g., steps 530, 550, and 560), and finalization logic 505 for comparing the expected voltage change to the actual voltage change (e.g., step 565), setting the final end time of the time interval (e.g., steps 570 and 575), and extracting the initial and ending current values for each time interval to generate data set 506 (e.g., step 580).

Data set 506 can be written to some form of computer-readable medium, such as memory within computer system 501, a removable storage medium (e.g., CDROM or DVD), or a network storage location.

Figure 4:
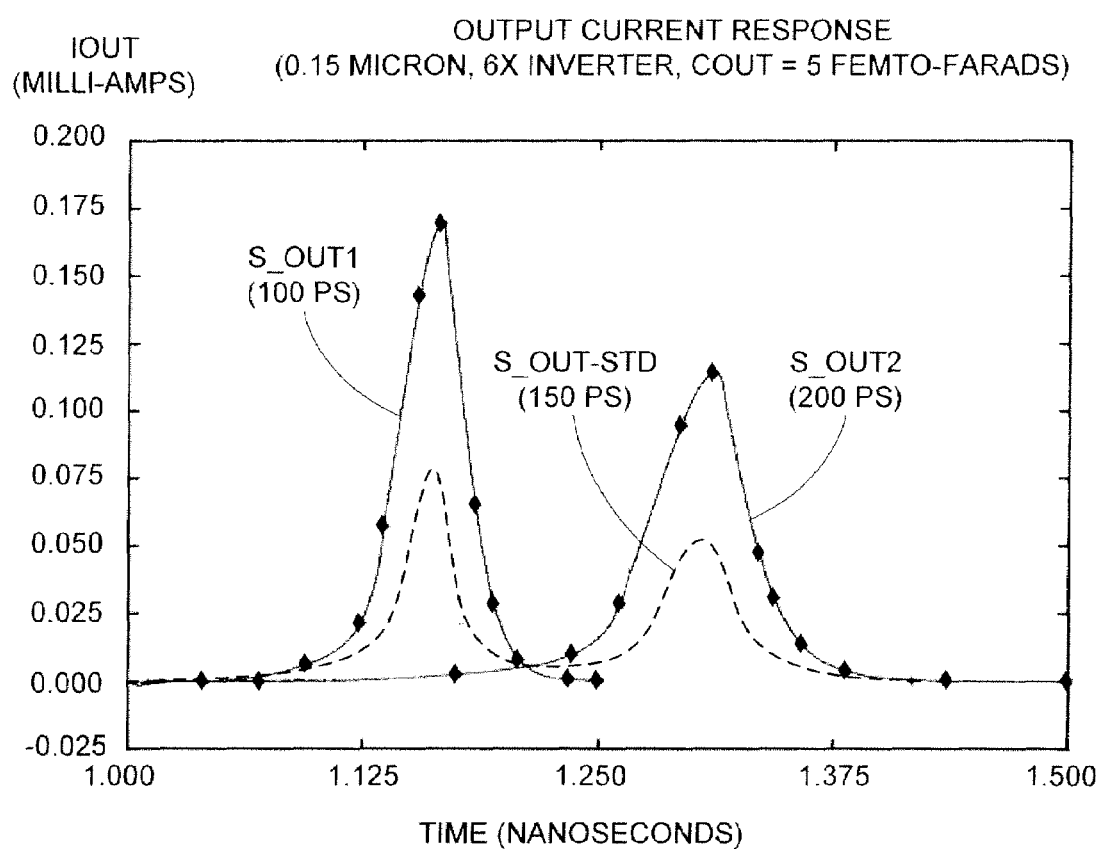
FIG. 4 is a graph of a model output current result generated using a conventional direct interpolation process.

To generate driver model outputs using a cell library that includes sets of output current signal data (e.g., piecewise linear representations generated as described with respect to FIGS. 5A-5C), conformal mapping can be used to ensure accurate modeling results. Rather than directly interpolating between two sets of signal data according to an indexing parameter such as input slew or output capacitance (and generating an inaccurate output signal such as described with respect to FIG. 4), conformal mapping scales the precharacterization signals along both the X and Y axes (i.e., time and current) according to the indexing parameter to create a more representative model output signal.

Figure 6A:
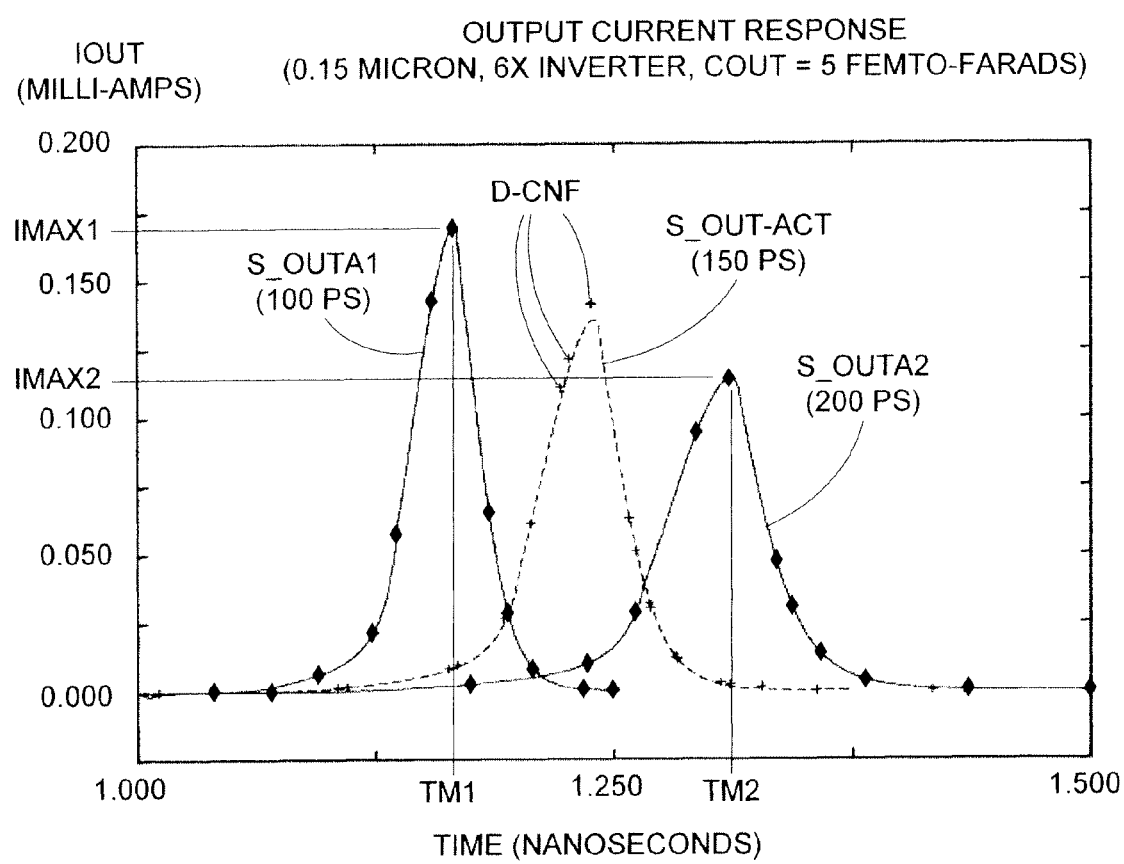
FIG. 6A is a graph of a model output current result generated using a conformal mapping process.

FIG. 6A shows graphs of two sets of precharacterization signal data for precharacterization output current signals S_OUTA1 (associated with an input slew of 100 ps) and S_OUTA2 (associated with an input slew of 200 ps). The data points making up the piecewise linear representations of the two output current signals are depicted as diamonds. Also shown in FIG. 6A is a set of model output data points D-CNF (for a model input slew of 150 ps) generated via conformal mapping of the precharacterization signal data. Model output data points D-CNF are depicted as "plus" signs and provide an accurate piecewise linear representation of an actual output current signal S_OUT-ACT (shown as a dashed line) associated with an input slew of 150 ps.

Figure 6B:
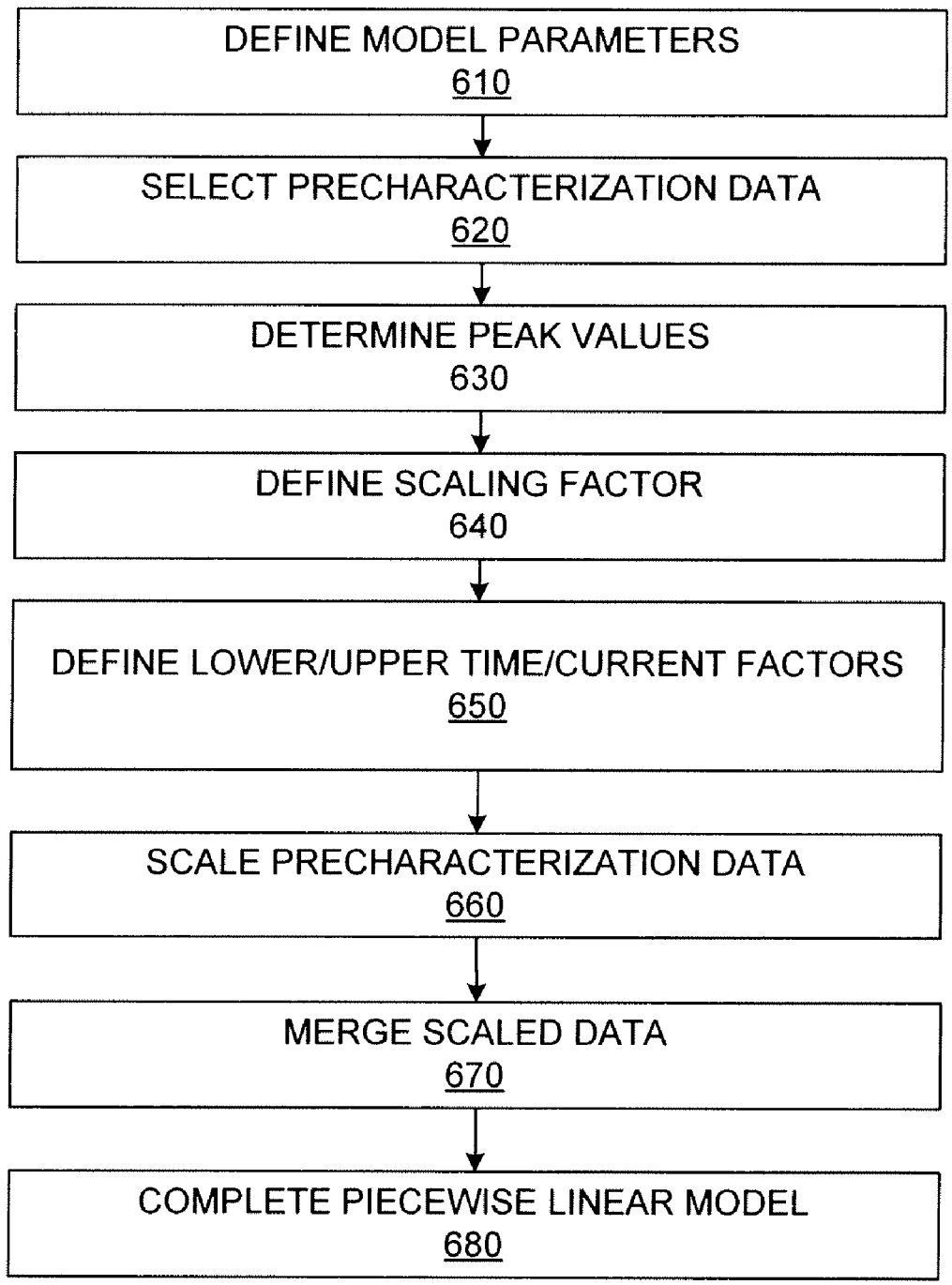
FIG. 6B is a flow diagram of a model output current generation process incorporating a conformal mapping methodology.

FIG. 6B shows a flow diagram of a method for generating conformally mapped model output data points D-CNF shown in FIG. 6A. First, model values for input slew and output capacitance are specified in a "DEFINE MODEL PARAMETERS" step 610. Then, based on those model indexing parameter values, two sets of precharacterization signal data from a cell library are selected in a "SELECT PRECHARACTERIZATION DATA" step 620. The sets of precharacterization signal data are selected such that for one of the indexing parameters, both of the data sets have the same value as the model value for one of the indexing parameters (e.g., the same output capacitance values), for the other indexing parameter, the values associated with the precharacterization data sets surround the model value.

Specifically, the indexing parameter value (e.g., input slew of 100 ps) for one of the precharacterization data sets is less than the model indexing parameter value (e.g., 150 ps), while the indexing parameter value (e.g., 200 ps) for the other precharacterization data set is greater than the model indexing parameter value. For explanatory purposes, the set of precharacterization data associated with the indexing parameter value greater than the model indexing parameter value is referred to as the "upper precharacterization data set", while the set of precharacterization data associated with the indexing parameter value less than the model indexing parameter value is referred to as the "lower precharacterization data set".

Next, in a "DETERMINE PEAK VALUES" step 630, maximum values (and the time at which that maximum value is attained) for both the upper precharacterization data set and the lower precharacterization data set are selected. For example, the lower precharacterization data set (associated with output current signal S_OUTA1) has a maximum value IMAX1 that occurs at a time TM1, while the upper precharacterization data set (associated with output current signal S_OUTA2) has a maximum value IMAX2 that occurs at a time TM2.

In a "DEFINE SCALING FACTOR" step 630, a scale factor based on the indexing parameter values for the sets of precharacterization signal data and the model indexing parameter value is generated. In one embodiment, the scale factor can be defined as follows:

$$X=(IPM-IP1)/(IP2-IP1) \quad [5]$$

where X is the scale factor, IPM is the model indexing parameter value (e.g., 150 ps), and IP1 and IP2 are the lower and upper precharacterization indexing parameter values, respectively (e.g., 100 ps and 200 ps, respectively). As indicated by Equation 5, scale factor X indicates the indexing parameter weighting of the model output relative to the precharacterization signal data.

Then, in a "DEFINE LOWER/UPPER TIME/CURRENT FACTORS" step 650, a set of time and current factors are generated for both the upper and lower precharacterization data sets. Each factor represents a peak value-based weighting factor for one of the upper and lower precharacterization data sets (i.e., based on the peak values determined in step 620 and the scaling factor calculated in step 630). For example, in one embodiment, the lower time factor can be calculated as follows:

$$TF1=1+X*((TM1/TM2)-1) \quad [6]$$

wherein TF1 is the lower time factor, X is the scale factor (determined in Equation 5), and TM1 and TM2 are the lower and upper peak times, respectively. The lower current factor can then be determined as follows:

$$IF1=1+X*((IMAX1/IMAX2)-1) \quad [7]$$

wherein IF1 is the lower current factor, X is the scale factor, and IMAX1 and IMAX2 are the lower and upper peak current values, respectively.

In a similar manner, the upper time factor can be calculated as follows:

$$TF2=1+(1-X)*((TM1/TM2)-1) \quad [8]$$

where TF2 is the upper time factor, X is the scale factor (note that 1−X is the complement of scale factor X), and TM1 and TM2 are the lower and upper peak times, respectively. Finally, the upper current factor can be determined as follows:

$$IF2=1+(1-X)*((IMAX1/IMAX2)-1) \quad [9]$$

wherein IF2 is the upper current factor, X is the scale factor, and IMAX1 and IMAX2 are the lower and upper peak current values, respectively.

The upper and lower precharacterization data sets can then be scaled using the upper and lower time/current factors, respectively, in a "SCALE PRECHARACTERIZATION DATA" step 660. Specifically, the time and output current values in the lower precharacterization data set can be multiplied by the lower time and current factors (i.e., TF1 and IF1), respectively, to generate an adjusted lower output data set.

For example, Table 2 shows an exemplary adjusted lower output data set generated using output current data set SET1 from Table 1. Each time value in data set SET1 is multiplied by lower time factor TF1 to generate a set of adjusted time values T1A, while each output current value is multiplied by lower current factor IF1 to generate a set of adjusted lower output current values I1A.

TABLE 2

| Time T1A | Adjusted Lower Output Current I1A |
|---|---|
| t1*TF1 | IoutA1*IF1 |
| t2*TF1 | IoutA2*IF1 |

TABLE 2-continued

| Time T1A | Adjusted Lower Output Current I1A |
|---|---|
| t3*TF1 | IoutA3*IF1 |
| t4*TF1 | IoutA4*IF1 |
| t5*TF1 | IoutA5*IF1 |
| t6*TF1 | IoutA6*IF1 |
| t7*TF1 | IoutA7*IF1 |
| t8*TF1 | IoutA8*IF1 |
| t9*TF1 | IoutA9*IF1 |
| t10*TF1 | IoutA10*IF1 |

Similarly, the time and output current values in the upper precharacterization data set can be multiplied by the upper time and current factors (i.e., TF2 and IF2), respectively, to generate an adjusted upper output data set. For example, Table 3 shows an exemplary adjusted upper output data set generated using output current data set SET2 from Table 1. Each time value in data set SET2 is multiplied by upper time factor TF2 to generate a set of adjusted time values T2A, while each output current value is multiplied by upper current factor IF2 to generate a set of adjusted lower output current values I2A.

TABLE 3

| Time T2A | Adjusted Upper Output Current I2A |
|---|---|
| t1*TF2 | IoutB1*IF2 |
| t2*TF2 | IoutB2*IF2 |
| t3*TF2 | IoutB3*IF2 |
| t4*TF2 | IoutB4*IF2 |
| t5*TF2 | IoutB5*IF2 |
| t6*TF2 | IoutB6*IF2 |
| t7*TF2 | IoutB7*IF2 |
| t8*TF2 | IoutB8*IF2 |
| t9*TF2 | IoutB9*IF2 |
| t10*TF2 | IoutB10*IF2 |

The adjusted upper and lower data sets are then merged in a "MERGE SCALED DATA" step 670 to generate a model output data set. The merging operation generates a model output current value at each adjusted time value calculated in step 660. Specifically, at each adjusted time value, a weighted difference methodology is used to combine the adjusted output current value calculated in step 660 with a scaled offset current value to define the model output current value at that adjusted time value. The scaled offset current value is based on the difference between the adjusted output current values from the upper and lower precharacterization data sets multiplied and the scale factor determined in step 630.

Thus, if the adjusted time is from the adjusted lower data set I1A from Table 2, the model output current can be determined as follows:

$$IMOD(T1A)=I1A(T1A)+X*(I2A(T1A)-I1A(T1A)) \quad [10]$$

where IMOD(T1A) is the model output current value at time T1A, I1A(T1A) is the adjusted lower current value at time T1A, X is the scale factor, and I2A(T1A) is the adjusted upper current value at time T1A. Note that adjusted upper current value I2A(T1A) will typically be interpolated from the data in the adjusted upper output data set, since time T1A will generally not exactly match any of the set of adjusted time values T2A. Thus, the final model output current at each time T1A is determined by adding to the original adjusted lower current value a weighted difference between the adjusted lower current value at the time T1A and an interpolated upper current value at the time T1A. Similarly, if the adjusted time is from the adjusted upper data set I2A in Table 3, the model output current can be determined as follows:

$$IMOD(T2A)=I2A(T2A)+(1-X)*(I1A(T2A)-I2A(T2A)) \quad [11]$$

where IMOD(T2A) is the model output current value at time T2A, I2A(T2A) is the adjusted upper current value at time T2A, X is the scale factor, and I1A(T2A) is the adjusted lower current value at time T2A. Just as described with respect to Equation 10, adjusted lower current value I1A(T2A) will typically be interpolated from the data in the adjusted lower output data set, since time T2A will generally not exactly match any of the set of adjusted time values T1A).

By applying Equations 10 and 11 at each adjusted time value T1A and T2A, respectively, a final set of model output current values can be generated and compiled into a model output data set associated with the input slew and output capacitance values defined in step 610 in a "COMPLETE PIECEWISE LINEAR MODEL" step 680. In this manner, an accurate model output current data set can be generated.

Figure 6C:
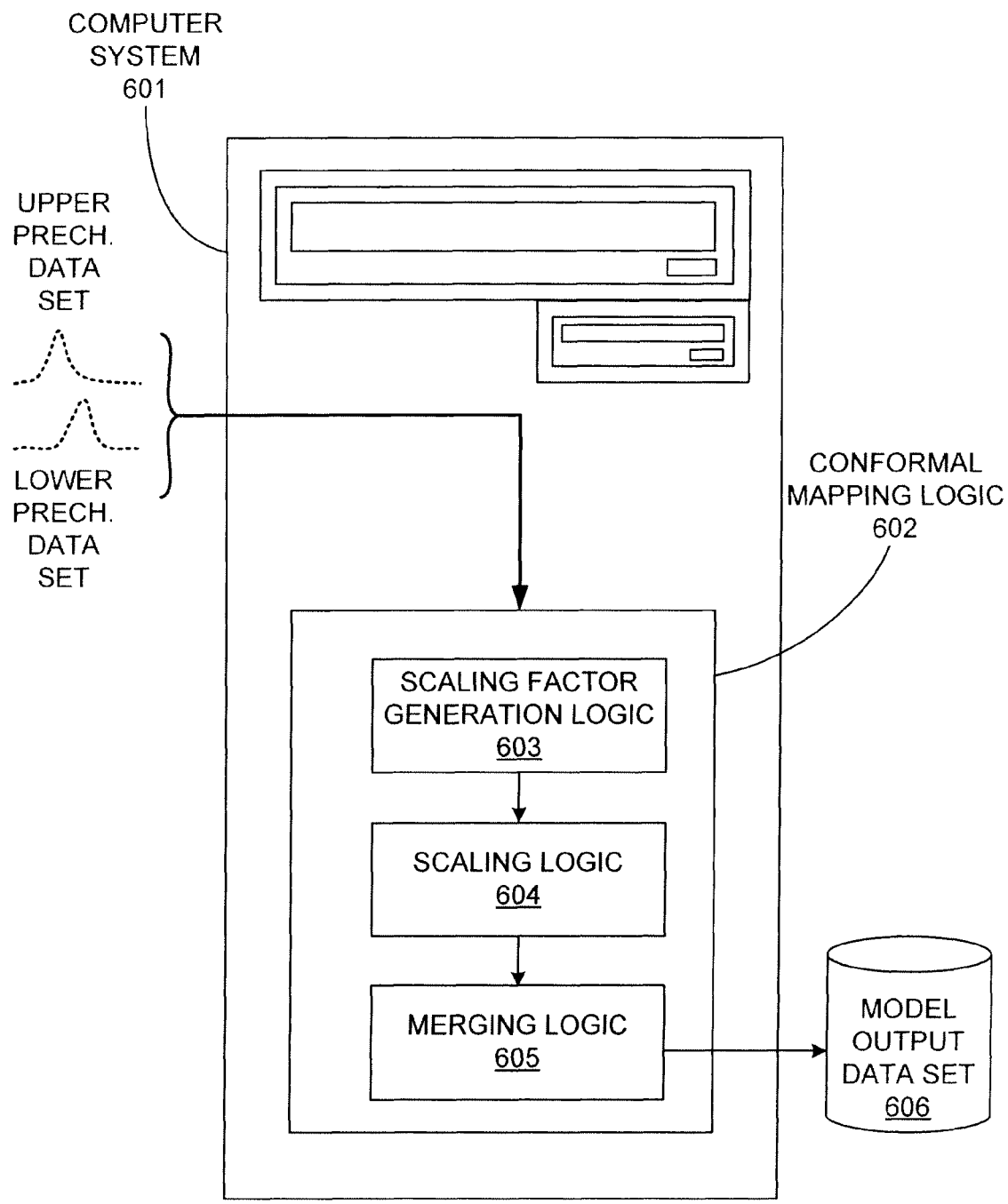
FIG. 6C is a block diagram of a system for generating a model output current using conformal mapping.

FIG. 6C shows a computer system 601 that includes conformal mapping logic 602 for transforming upper and lower precharacterization data sets into a model output data set 606, according to the steps described with respect to FIG. 6B. Conformal mapping logic 602 includes scaling factor generation logic 603 for detecting peak current values and times (e.g., step 630) and generating scale factor X (e.g., step 640) and upper/lower time/current factors TF1, TF2, IF1, and IF2 (e.g., step 650), scaling logic 604 for applying those scaling factors to the precharacterization data to generate adjusted output data (e.g., step 660), and merging logic 605 for merging the adjusted output data into model output data set 606 (e.g., steps 670 and 680). Data set 606 can be written to some form of computer-readable medium, such as memory within computer system 601, a removable storage medium (e.g., CDROM or DVD), or a network storage location.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A computer-readable medium embodying instructions that when executed by a computer system, perform steps for modeling a driver cell, wherein when an output capacitance of the driver cell is equal to a first output capacitance and an input signal having a first input slew is applied to the driver cell, the driver cell generates a first output current signal and a first voltage signal, the steps comprising:
    segmenting the first output current signal along a plurality of time intervals, wherein for each of the plurality of time intervals, an expected output voltage change based on an integral of the first output current signal over the time interval matches an actual change in the first voltage signal over the time interval within a predetermined tolerance;
    storing beginning and ending output current values and time values from each of the plurality of time intervals as a first piecewise linear representation of the first output current signal, the first piecewise linear representation being referenced by the first input slew and the first output capacitance; and
    outputting a model of the driver cell based on the first piecewise linear representation.

2. The computer-readable medium of claim 1, wherein segmenting the first output current signal comprises:
    specifying an initial time of a first one of the plurality of time intervals;
    selecting an end time of the first one of the plurality of time intervals;
    increasing the end time of the first one of the plurality of time intervals until the expected output voltage change over the first one of the plurality of time intervals exceeds the actual change in the first voltage signal over the first one of the plurality of time intervals;
    finalizing the end time of the first one of the plurality of time intervals; and
    specifying the end time of the first one of the plurality of time intervals as an initial time of a second one of the plurality of time intervals.

3. The computer-readable medium of claim 2, wherein segmenting the first output current signal further comprises:
    determining an initial current value of the first output current signal at the initial time of the first one of the plurality of time intervals;
    determining an initial voltage value of the first voltage signal at the initial time of the first one of the plurality of time intervals;
    determining an end current value of the first output current signal at the end time of the first one of the plurality of time intervals;
    performing a linear current integration over the first one of the plurality of time intervals using the initial current value, the initial time of the first one of the plurality of time intervals, the end current value, the end time of the first one of the plurality of time intervals, and the first output capacitance to generate the expected output voltage change; and
    subtracting the initial voltage value from the end voltage value to generate the actual change in the first voltage signal.

4. The computer-readable medium of claim 3, wherein performing the linear current integration comprises:
    averaging the initial current value and the end current value to generate an average current value;
    subtracting the initial time from the end time to generate a time difference;
    multiplying the average current value and the time difference to generate an intermediate value; and
    dividing the intermediate value by the first output capacitance to generate the expected output voltage change.

5. The computer-readable medium of claim 2, wherein finalizing the end time comprises reducing the end time until the expected output voltage change over the first one of the time intervals is less than the actual change in the first voltage signal over the first one of the time intervals.

6. The computer-readable medium of claim 2, wherein increasing the end time comprises adding a predetermined time increment to the end time, and
    wherein finalizing the end time comprises subtracting the predetermined time increment from the end time.

7. A computer-readable medium embodying instructions that when executed by a computer system, perform steps for generating a piecewise linear representation of an output current signal from a driver cell, the steps comprising:
    segmenting the output current signal into a plurality of segments and generating a data set including the piecewise linear representation of the output current signal after processing of the plurality of segments, the data set forming part of a model of the driver cell, wherein for each of the plurality of segments an expected voltage change generated by integrating the output current signal over the segment matches an actual voltage change across a corresponding portion of an output voltage signal from the driver cell.

8. The computer-readable medium of claim 7, wherein segmenting the output current signal comprises:

specifying an initial time and adjusting an end time for each of the plurality of segments;

integrating the output current signal between the initial time and the end time to generate the expected voltage change; and instructing an interval selection logic to increase the end time of each of the plurality of segments until the expected voltage change for the segment differs from the actual voltage change across the corresponding portion of the output voltage signal by a predetermined tolerance.

9. The computer-readable medium of claim 8, wherein the predetermined tolerance comprises a constant value.

10. The computer-readable medium of claim 8, wherein the predetermined tolerance varies across the output current signal.

11. The computer-readable medium of claim 10, wherein the predetermined tolerance is reduced at a peak of the output current signal.

12. The computer-readable medium of claim 8, wherein instructing the interval selection logic further comprises setting the end time of each of the plurality of segments such that the expected voltage change for the segment differs from the actual voltage change across the corresponding portion of the output signal by less than the predetermined tolerance.

13. The computer-readable medium of claim 12, wherein instructing the interval selection logic further comprises compiling current and time values from a beginning and an end of each of the plurality of segments into the piecewise linear representation of the output current signal.

14. A computer-readable medium embodying instructions that when executed by a computer system, perform steps for generating a model output current signal for a driver model, the steps comprising:

specifying a first model value for a first indexing parameter and a second model value for a second indexing parameter;

selecting a first set of precharacterization output current data indexed by a first precharacterization value for the first indexing parameter and the second model value for the second indexing parameter;

selecting a second set of precharacterization output current data indexed by a second precharacterization value for the first indexing parameter and the second model value for the second indexing parameter;

conformally mapping the first set of precharacterization output current data and the second set of precharacterization output current data according to the first model value, the first precharacterization value, and the second precharacterization value to generate a set of model output data for the model output current signal; and storing the set of model output data in a computer-readable medium for use during timing analyses.

15. The computer-readable medium of claim 14, wherein the first precharacterization value is less than the first model value, and wherein the second precharacterization value is greater than the first model value, and wherein conformally mapping comprises:

defining a scaling factor, the scaling factor indicating a weighting of the model output current signal relative to the first set of precharacterization output current data and the second set of precharacterization output current data according to the first indexing parameter;

selecting a first peak value from the first set of precharacterization output current data, the first peak value occurring at a first peak time;

selecting a second peak value from the second set of precharacterization output data, the second peak value occurring at a second peak time;

defining a lower current weighting factor based on the first peak value, the second peak value, and the scaling factor;

defining a lower time weighting factor based on the first peak time, the second peak time, and the scaling factor;

defining an upper current weighting factor based on the first peak value, the second peak value, and a complement of the scaling factor;

defining an upper time weighting factor based on the first peak time, the second peak time, and a complement of the scaling factor;

generating a first set of adjusted data values by multiplying a first set of output current values and a first set of time values in the first set of precharacterization output current data by the lower current weighting factor and the lower time weighting factor, respectively;

generating a second set of adjusted data values by multiplying a second set of output current values and a second set of time values in the second set of precharacterization output current data by the upper current weighting factor and the upper time weighting factor, respectively; and merging the first set of adjusted data values and the second set of adjusted data values to generate the set of model output data.

16. The computer-readable medium of claim 15, wherein the scaling factor is generated by dividing a difference between the first model value and the first precharacterization value by a difference between the second precharacterization value and the first precharacterization value.

17. The computer-readable medium of claim 16, wherein the lower current weighting factor is determined from an equation:

$$IF1 = 1 + X*((IMAX1/IMAX2) - 1)$$

where IF1 is the lower current weighting factor, X is the scaling factor, IMAX1 is the first peak value, and IMAX2 is the second peak value, wherein the lower time weighting factor is determined from an equation:

$$TF1 = 1 + X*((TM1/TM2) - 1)$$

where TF1 is the lower time weighting factor, TM1 is the first peak time, and TM2 is the second peak time, wherein the upper current weighting factor is determined from an equation:

$$IF2 = 1 + X'*((IMAX1/IMAX2) - 1)$$

where IF2 is the upper current weighting factor and X' is the complement of the scaling factor, and wherein the upper time weighting factor is determined from an equation:

$$TF2 = 1 + (1 - X)*((TM1/TM2) - 1)$$

where TF2 is the upper time weighting factor.

18. The computer-readable medium of claim 16, wherein the first set of adjusted data values includes a set of adjusted lower current values indexed by a set of adjusted lower time values, wherein the second set of adjusted data values includes a set of adjusted upper current values indexed by a set of adjusted upper time values, and wherein merging the first set of adjusted data values and the second set of adjusted data values comprises:

interpolating the second set of adjusted data values at each of the set of adjusted lower time values to generate a first set of intermediate current values indexed by the set of adjusted lower time values;

generating a set of lower model output data by, at each of the adjusted lower time values, calculating a first weighted difference between the adjusted lower current value and the one of the first set of intermediate current values at the adjusted lower time value, and adding the first weighted difference to the adjusted lower current value at the adjusted lower time value to generate a lower final output current value;

interpolating the first set of adjusted data values at each of the set of adjusted upper time values to generate a second set of intermediate current values indexed by the set of adjusted upper time values;

generating a set of upper model output data by, at each of the adjusted upper time values, calculating a second weighted difference between the adjusted upper current value and the one of the second set of intermediate current values at the adjusted upper time value, and adding the second weighted difference to the adjusted upper current value at the adjusted upper time value to generate an upper final output current value; and combining the set of lower model output data and the set of upper model output data to generate the set of model output data.

19. The computer-readable medium of claim 18, wherein the first weighted difference is determined from an equation:

$$WDIFF1 = X*(I2A(T1A) - I1A(T1A))$$

where WDIFF1 is the first weighted difference, X is the scaling factor, T1A is the adjusted lower time value, I2A(T1A) is the one of the first set of intermediate current values at the adjusted lower time value, and I1A(T1A) is the adjusted lower current value at the adjusted lower time value, and wherein the second weighted difference is determined from an equation:

$$WDIFF2 = X'*(I1A(T2A) - I2A(T2A))$$

where WDIFF2 is the second weighted difference, X' is the complement of scaling factor X, T2A is the adjusted upper time value, I1A(T2A) is the one of the second set of intermediate current values at the adjusted upper time value, and I2A(T2A) is the adjusted upper current value at the adjusted upper time value.

20. A computer-readable medium embodying instructions that when executed by a computer system, perform steps for generating a model output signal from a first set of precharacterization output data and a second set of precharacterization output data, the model output signal being associated with a first value for an indexing parameter, the first set of precharacterization output data being associated with a second value for the indexing parameter, and the second set of precharacterization output data being associated with a third value for the indexing parameter, the steps comprising:

calculating a scale factor indicating weighting of the model output signal relative to the first set of precharacterization output data and the second set of precharacterization output data according to the indexing parameter;

scaling the first set of precharacterization output data and the second set of precharacterization output data to generate a first adjusted data set and a second adjusted data set, respectively, according to the scale factor and weighting factors based on a first peak of the first set of precharacterization output data and a second peak of the second set of precharacterization output data; and creating a final set of model output data by modifying the first adjusted data set and the second adjusted data set using a weighted difference algorithm, the final set of model output data being stored for a driver model.

21. The computer-readable medium of claim 20, wherein the first value is greater than the second value and less than the third value, wherein the first peak is at a first current value and a first time value, wherein the second peak is at a second current value and a second time value, wherein the scale factor is equal to a difference between the first value and the second value divided by a difference between the third value and the second value, wherein scaling the first set of precharacterization output data and the second set of precharacterization output data comprises:

generating a lower time factor from the first time value, the second time value, and the scale factor;

generating a lower current factor from the first current value, the second current value, and the scale factor;

generating an upper time factor from the first time value, the second time value, and a complement of the scale factor;

generating an upper current factor from the first current value, the second current value, and the complement of the scale factor;

multiplying a set of lower time values and a set of lower current values in the first set of precharacterization output data with the lower time factor and the lower current factor, respectively, to generate the first adjusted data set; and multiplying a set of upper time values and a set of upper current values in the second set of precharacterization output data with the upper time factor and the upper current factor, respectively, to generate the second adjusted data set.

22. The computer-readable medium of claim 20, wherein the first adjusted data set includes a set of adjusted lower current values indexed by a set of adjusted lower time values, wherein the second adjusted data set includes a set of adjusted upper current values indexed by a set of adjusted upper time values, wherein creating the final set of model output data comprises:

interpolating the second adjusted data set to generate a set of intermediate upper current values indexed by the set of adjusted lower time values;

interpolating the first adjusted data set to generate a set of intermediate lower current values indexed by the set of adjusted upper time values;

modifying each of the set of adjusted lower current values by a first weighted difference of the adjusted lower current value and the intermediate upper current value at the adjusted lower time value to create a first set of model output data;

modifying each of the set of adjusted upper current values by a second weighted difference of the adjusted upper current value and the intermediate lower current value at the adjusted upper time value to generate a second set of model output data; and combining the first set of model output values with the second set of model output values to create the final set of model output data.

23. The computer-readable medium of claim 22, wherein the lower current factor is determined by an equation:

$$IF1 = 1 + X*((IMAX1/IMAX2) - 1)$$

where IF1 is the lower current factor, X is the scale factor, IMAX1 is the first current value, and IMAX2 is the second current value, wherein the lower time factor is determined from an equation:

$$TF1 = 1 + X*((TM1/TM2) - 1)$$

where TF1 is the lower time factor, TM1 is the first time value, and TM2 is the second time value, wherein the upper current factor is determined from an equation:

$$IF2 = 1 + X'*((IMAX1/IMAX2) - 1)$$

where IF2 is the upper current factor and X' is the complement of the scale factor, wherein the upper time factor is determined from an equation:

$$TF2 = 1 + (1 - X)*((TM1/TM2) - 1)$$

where TF2 is the upper time factor, wherein the first weighted difference is determined from an equation:

$$WDIFF1 = X*(I2A(T1A) - I1A(T1A))$$

where WDIFF1 is the first weighted difference, T1A is the adjusted lower time value, I2A(T1A) is the intermediate upper current value at the adjusted lower time value, and I1A(T1A) is the adjusted lower current value at the adjusted lower time value, and wherein the second weighted difference is determined from an equation:

$$WDIFF2 = X'*(I1A(T2A) - I2A(T2A))$$

where WDIFF2 is the second weighted difference, T2A is the adjusted upper time value, I1A(T2A) is the intermediate lower current value at the adjusted upper time value, and I2A(T2A) is the adjusted upper current value at the adjusted upper time value.

* * * * *

UNITED STATES PATENT AND TRADEMARK OFFICE
CERTIFICATE OF CORRECTION

| | | |
|---|---|---|
| PATENT NO. | : 8,032,342 B2 | Page 1 of 2 |
| APPLICATION NO. | : 12/432717 | |
| DATED | : October 4, 2011 | |
| INVENTOR(S) | : Harold J. Levy | |

It is certified that error appears in the above-identified patent and that said Letters Patent is hereby corrected as shown below:

On the Title Page

Item [57] ABSTRACT
Line 1, amend "linear piecewise" to --piecewise linear--.
Line 4, amend "portion" to --portions--.

In the Claims

Column 13
Claim 1, Line 58, amend "the" (second occurrence) to --a--.

Column 14
Claim 3, Line 38, amend "the" (second occurrence) to --an--.
Claim 5, Line 54, insert --plurality of-- before "time".
Claim 5, Line 55, insert --plurality of-- before "time".

Column 15
Claim 7, Line 5, amend "the" to --a--.

Column 16
Claim 15, Line 10, insert --current-- before "data".
Claim 15, Line 20, amend "a" to --the--.

Column 17
Claim 17, Line 12, amend "the" to --an--.
Claim 17, Line 13, delete "the" (first occurrence).
Claim 17, Line 24, amend "the" to --an--.
Claim 17, Line 25, delete "the" (first occurrence).

Signed and Sealed this
Eleventh Day of February, 2014

Michelle K. Lee
*Deputy Director of the United States Patent and Trademark Office*

CERTIFICATE OF CORRECTION (continued)
U.S. Pat. No. 8,032,342 B2

Column 18
Claim 22, Line 44, amend "20" to --21--.
Claim 22, Line 60, amend "the" to --an--.
Claim 22, Line 61, amend "the" to --an--.
Claim 22, Line 65, amend "the" to --an--.
Claim 22, Line 66, amend "the" to --an--.

Column 19
Claim 22, Line 1, amend "values" to --data--.
Claim 22, Line 2, amend "values" to --data--.